United States Patent [19]

Okanobu

[11] 4,309,656
[45] Jan. 5, 1982

[54] LEVEL INDICATING CIRCUIT
[75] Inventor: Taiwa Okanobu, Tokyo, Japan
[73] Assignee: Sony Corporation, Tokyo, Japan
[21] Appl. No.: 126,383
[22] Filed: Mar. 3, 1980
[30] Foreign Application Priority Data Mar. 5, 1979 [JP] Japan .................................. 54-25252

[51] Int. Cl.³ ...................... G01R 15/00; G01R 1/30; H04B 17/00
[52] U.S. Cl. .................................. 324/131; 307/362; 324/123 R; 455/226
[58] Field of Search ........................... 324/131, 123 R; 330/252, 259, 253, 255, 69; 340/660, 661; 307/362, 363; 328/150; 455/226, 67

[56] References Cited
U.S. PATENT DOCUMENTS 3,879,662 4/1975 Barneck ............................. 307/362
4,219,778 8/1980 Ishii .

Primary Examiner—Ernest F. Karlsen
Attorney, Agent, or Firm—Lewis H. Eslinger; Alvin Sinderbrand

[57] ABSTRACT

A level indicating circuit includes a pair of transistors, arranged as a differential amplifier and to whose bases an input signal is applied, a level-detecting circuit to supply to a meter or the like an indicating current whose level is related to the magnitude of the input signal; and a network connecting the collector of at least one of the transistors of the differential amplifier to the level-detecting circuit and establishing a threshold for the input signal such that the level-detecting circuit supplies its indicating current only when the input signal exceeds the threshold. The level-detecting circuit can include a transistor which is biased so as to begin conducting only when the magnitude of the input signal exceeds the dynamic range of the differential amplifier and drives one or the other of the transistors thereto to cutoff or saturation.

10 Claims, 5 Drawing Figures

LEVEL INDICATING CIRCUIT

BACKGROUND OF THE INVENTION

1. Field of the Invention

This invention generally relates to a level indicating circuit, and is particularly directed to an improved level indicating circuit of simple construction and which can be used with an intermediate frequency amplifier without draining its signal current.

2. Description of the Prior Art

In an FM receiver, input signal level (received electric field level) is conventionally indicated by rectifying an intermediate frequency signal and supplying such rectified intermediate frequency signal to a meter or the like.

Unfortunately, with this conventional technique, the rectifying circuit acts as a load on the intermediate frequency amplifier and drains current from the intermediate frequency signal. Also, the rectifying diode of the rectifying circuit needs to be supplied with voltage bias which requires a circuit of considerable complexity.

OBJECTS AND SUMMARY OF THE INVENTION

It is an object of this invention to provide a novel level indicating circuit which is simple in construction.

It is another object of this invention to provide a level indicating circuit which does not drain the signal current in an intermediate frequency amplifier.

It is a further object of this invention to provide a level indicating circuit which readily lends itself to construction as an integrated circuit.

According to an aspect of this invention, a level indicating circuit for indicating the magnitude or level of an input signal comprises first and second transistors whose collectors are connected through first and second resistors, respectively, to a source of potential, whose emitters are coupled to ground via an emitter resistor, and whose bases are arranged to receive the input signal; a level measuring circuit to produce an output current whose level is related to the magnitude of the input signal; and a network connecting the collector of the first transistor to the level-measuring circuit and effecting a threshold for the input signal such that the level-measuring circuit produces its output current only if the magnitude of the input signal is beyond the dynamic range of this first transistor, that is, only if the magnitude of the input signal is great enough to drive the first transistor to either saturation or cutoff.

The above, and other objects, features and advantages of the invention, will be apparent from the following description taken in conjunction with the accompanying drawings.

DESCRIPTION OF THE PREFERRED EMBODIMENTS

Figure 1:
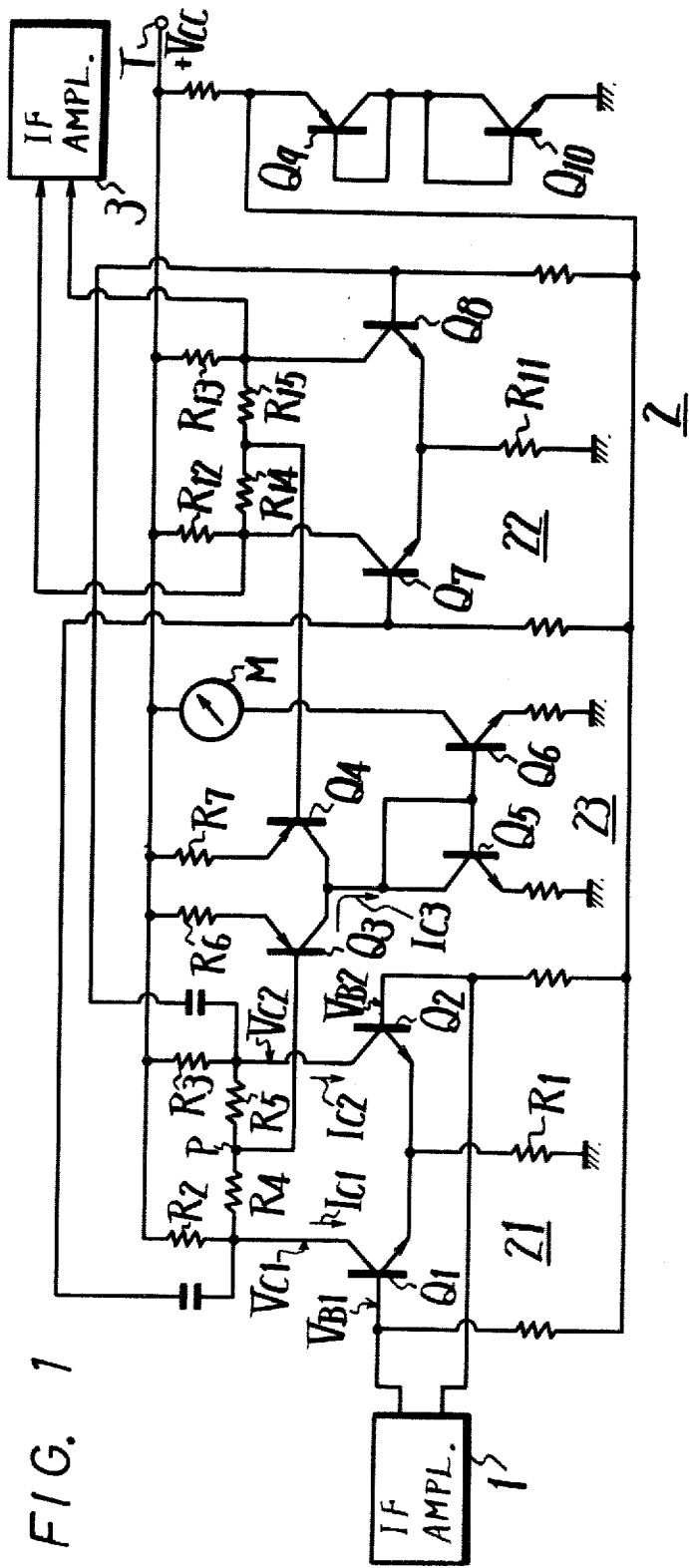
FIG. 1 is a circuit diagram showing an embodiment of this invention.

Referring to the drawings in detail, and initially to FIG. 1 thereof, it will be seen that an intermediate-frequency stage of a frequency-modulation receiver is there shown to be formed of front-stage, middle-stage, and rear-stage intermediate frequency amplifiers 1, 2 and 3, respectively, with the middle-stage intermediate frequency amplifier 2 being constituted by two differential amplifiers 21 and 22. Differential amplifier 21 includes transistors $Q_1$ and $Q_2$ whose emitter electrodes are connected in common to ground through a resistor $R_1$, and the collector electrodes of transistors $Q_1$ and $Q_2$ are connected through equal-value resistors $R_2$ and $R_3$, respectively, to a voltage supply terminal T to which a source voltage $+V_{cc}$ is supplied. The base electrodes of transistors $Q_1$ and $Q_2$ are biased by means of biasing transistors $Q_9$ and $Q_{10}$.

Differential amplifier 22 similarly includes transistors $Q_7$ and $Q_8$ having their emitter electrodes connected in common to ground through a resistor $R_{11}$, while the collector electrodes are connected through resistors $R_{12}$ and $R_{13}$ to voltage supply terminal T and the base electrodes are biased from biasing transistors $Q_9$ and $Q_{10}$.

Intermediate frequency amplifier 1 delivers oppositely phased versions of an intermediate frequency signal to the bases of transistors $Q_1$ and $Q_2$, respectively, for passage through differential amplifiers 21 and 22 to the rear-stage intermediate frequency amplifier 3.

Equal-value series resistors $R_4$ and $R_5$ are coupled to the collector electrodes of transistors $Q_1$ and $Q_2$, respectively, and are connected together to form a junction P therebetween. Similarly, equal-value resistors $R_{14}$ and $R_{15}$ are coupled to the collector electrodes of transistors $Q_7$ and $Q_8$, respectively, and also are connected together to form another junction therebetween.

A level-sensing circuit for sensing the level of the voltage appearing at the junction P includes a transistor $Q_3$ complementary to the transistors $Q_1$ and $Q_2$, a resistor $R_6$ connecting the emitter of transistor $Q_3$ to the voltage supply terminal T, and a current mirror circuit 23. The base of transistor $Q_3$ is coupled to the junction P. An additional transistor $Q_4$ which is of the same type as transistor $Q_3$ and is thus complementary to transistors $Q_7$ and $Q_8$ is included to sense the level of the voltage appearing at the junction of resistors $R_{14}$ and $R_{15}$. A resistor $R_7$ couples the emitter of transistor $Q_4$ to the voltage supply terminal T, and the collector of transistor $Q_4$ is coupled to the collector of transistor $Q_3$ and to the current mirror circuit 23. The base of transistor $Q_4$ is connected to the junction formed between resistors $R_{14}$ and $R_{15}$.

The current mirror circuit 23 includes an input-side transistor $Q_5$ whose base and collector are coupled to the collectors of transistors $Q_3$ and $Q_4$ and whose emitter is coupled to ground, and an output-side transistor $Q_6$ whose base is connected to the base and collector of the transistor $Q_5$ and whose emitter is coupled to ground. An indicator M, which can, for example, by any convenient meter, connects the collector of transistor $Q_6$ to the voltage supply terminal T. It is apparent that a current proportional to the sum of currents flowing in the collectors of transistors $Q_3$ and $Q_4$ will be provided in the indicator M by reason of the mirror circuit 23.

According to this invention, the values of the resistors $R_1$ to $R_5$ of differential amplifier 21 and the value of resistor $R_6$ in the level sensing circuit are selected to have appropriate values such that the transistor $Q_3$ begins to conduct only when one or the other of transistors $Q_1$ and $Q_2$ is driven outside its linear range of amplification to saturation or cutoff. The values of resistors $R_7$ and $R_{11}$ to $R_{15}$ are similarly selected so that transistor $Q_4$ does not begin to conduct until one of transistors $Q_7$ and $Q_8$ is driven to saturation or cutoff.

Figure 2A:
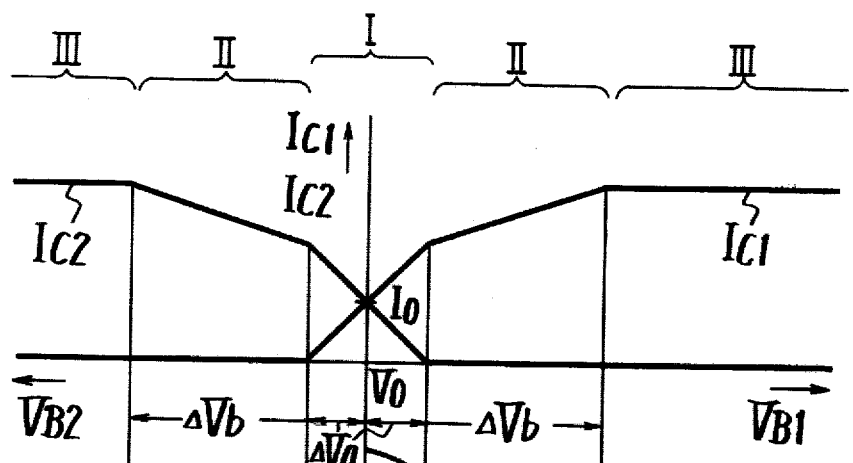
FIGS. 2A, 2B and 2C are graphs to which reference will be made in explaining the operation of the circuit of FIG. 1.

As shown in FIG. 2A, a quiescent base bias voltage $V_0$ is applied to the base of each of transistors $Q_1$ and $Q_2$ which have respective collector currents $I_{C1}$ and $I_{C2}$ which follow the current-to-voltage characteristics illustrated by the solid lines. When no signal is applied to the bases of transistors $Q_1$ and $Q_2$, the currents $I_{C1}$ and $I_{C2}$ are each equal to a quiescent collector current value $I_0$.

An input signal $E_i$, here occurring as complementarily varying voltages $V_{B1}$ and $V_{B2}$, fluctuates above and below the quiescent voltage $V_0$. The voltages $V_{B1}$ and $V_{B2}$ appear at the bases of transistors $Q_1$ and $Q_2$, and the collector currents $I_{C1}$ and $I_{C2}$ of these transistors are caused to vary complementarily so long as the magnitude, or center-to-peak value of the input signal $E_i$ remains in a linear range (Region I of FIG. 2A) of the differential amplifier 21, and the voltages $V_{B1}$ and $V_{B2}$ satisfy the relations.

$(V_0 - \Delta V_a) < V_{B1} < (V_0 + \Delta V_a)$, and
$(V_0 - \Delta V_a) < V_{B2} < (V_0 + \Delta V_a)$ where $\Delta V_a$ is the input signal amplitude required to drive the transistors $Q_1$ and $Q_2$ to cutoff. In the linear range, collector currents $I_{C1}$ and $I_{C2}$ remain proportional to voltages $V_{B1}$ and $V_{B2}$, respectively, with the result that collector currents $I_{C1}$ and $I_{C2}$ have a constant sum equal to twice the quiescent collector current $$I_{C1} + I_{C2} = 2I_0.$$

When the magnitude of the input signal $E_i$ extends into a semi-linear region (Region II of FIG. 2A), voltages $V_{B1}$ and $V_{B2}$ satisfy the relations $(V_0 + \Delta V_a) \leq V_{B1} < (V_0 + \Delta V_b)$ and
$(V_0 - \Delta V_b) < V_{B2} \leq (V_0 - \Delta V_a)$, where $\Delta V_b$ is the voltage required to drive the transistors $Q_1$ and $Q_2$ to saturation. In the semi-linear region the transistor $Q_2$ is turned off, and its emitter current $I_{C2}$ becomes zero. Here, the amplifier 21 behaves as though transistor $Q_1$ were a simple grounded emitter transistor, so that the current $I_{C1}$ is proportional to the voltage $V_{B1}$, but the gain afforded by amplifier 21 is somewhat less than for the input signal $E_i$ in region I.

Further, when input signal $E_i$ extends into a saturated region (Region II of FIG. 2A) and the relations $V_0 + \Delta V_b \leq V_{B1}$ and $V_{B2} \leq V_0 - \Delta V_b$ are satisfied, the transistor $Q_2$ is turned off so that its collector current $I_{C2}$ becomes zero, and the transistor $Q_1$ is turned on, or saturated, so that its collector current $I_{C1}$ is constant.

Because of the selection of quiescent voltage $V_0$ and the symmetrical arrangement of the differential amplifier 21, the relation of voltages $V_{B1}$ and $V_{B2}$ to respective collector currents $I_{C1}$ and $I_{C2}$ is symmetric about the center with the characteristic as shown in FIG. 2A. Therefore, if the input signal $E_i$ is an intermediate frequency signal superimposed on a DC voltage $V_0$, the transistors $Q_1$ and $Q_2$ of the differential amplifier 21 amplify the input signal. Furthermore, the differential amplifier acts as a limiter when the magnitude of the input signal exceeds a predetermined level (here $\Delta V_b$).

Figure 2B:
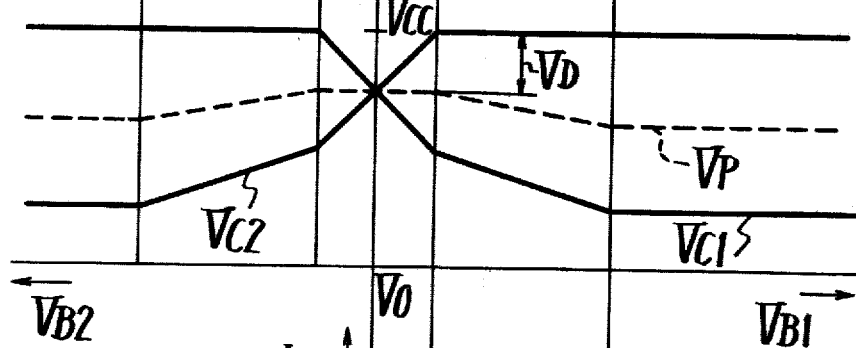

Since the collector currents $I_{C1}$ and $I_{C2}$ fluctuate with the intermediate frequency input signal $E_i$, transistors $Q_1$ and $Q_2$ will have collector voltages $V_{C1}$ and $V_{C2}$ that fluctuate in a corresponding inverted fashion, as indicated by solid lines in FIG. 2B. At the same time since the voltage $V_P$ at the junction P represents the average of the two collector voltages $V_{C1}$ and $V_{C2}$ and satisfies the relation $$V_P = \tfrac{1}{2}(V_{C1} + V_{C2}),$$

the voltage $V_P$ will fluctuate with the magnitude of input signal $E_i$ as shown by the broken line in FIG. 2B. In other words, when the instantaneous value of the magnitude of intermediate frequency signal $E_i$ does not exceed $\Delta V_a$, the relation $V_P = V_{cc} - V_D$ is satisfied where $V_D$ is the quiescent voltage drop of the transistors $Q_1$ and $Q_2$ and the resistor $R_3$, so that the voltage $V_P$ is a constant. When the instantaneous value of the magnitude of signal $E_i$ exceeds $\Delta V_a$ but does not exceed $\Delta V_b$, the voltage $V_P$ changes in accordance with the signal voltage $E_i$. Further, when the instantaneous value of the signal $E_i$ exceeds $\Delta V_b$, the voltage $V_P$ is also constant. The voltage $V_D$ can be arbitrarily determined by selecting the values of the resistors $R_1$ through $R_5$.

Figure 2C:
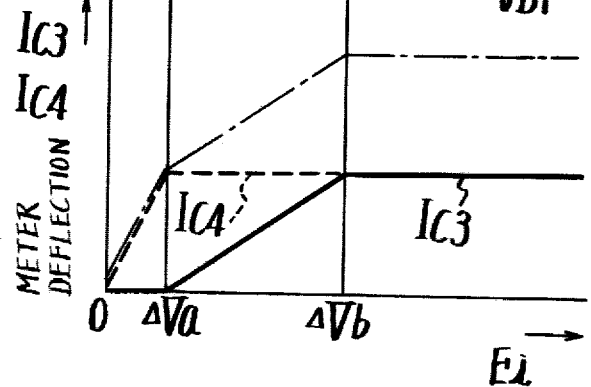

As mentioned earlier, voltage $V_P$ is supplied to the base electrode of the transistor $Q_3$. Thus, if the threshold level for rendering the transistor $Q_3$ conductive is set equal to the voltage $V_D$, the transistor $Q_3$ will provide a collector current $I_{C3}$ having a relationship to the magnitude of the input signal $E_i$ as depicted by the solid line in FIG. 2C. As shown, when the input signal $E_i$ satisfies the relation $E_i < \Delta V_a$, the current $I_{C3}$ is zero; when the signal $E_i$ has sufficient magnitude so as to satisfy the relation $$\Delta V_a \leq E_i \leq V_b,$$

the current $I_{C3}$ increases with corresponding increases in the magnitude of signal $E_i$; and when $E_i$ is sufficiently great so as to satisfy the relation $E_i > \Delta V_b$, the current $I_{C3}$ is constant.

As the current $I_{C3}$ is supplied to input-side transistor $Q_5$ of current mirror circuit 23, a current proportional to current $I_{C3}$ will flow through output-side transistor $Q_6$ and hence through indicator M.

A similar operation is also carried out by the differential amplifier 22 and by transistor $Q_4$, except that transistors $Q_7$ and $Q_8$ reach their cutoff and saturation levels faster than transistors $Q_1$ and $Q_2$ owing to the gain afforded the input signal $E_i$ by the amplifier 21. Transistor $Q_4$ also supplies current $I_{C4}$ to the current mirror circuit 23. Current $I_{C4}$ of the transistor $Q_4$ varies with respect to the magnitude of signal $E_i$ as depicted by dash lines in FIG. 2C. Thus, a current equivalent to the sum of currents $I_{C3}$ and $I_{C4}$ flows through the indicator M, so that the indication on indicator M will respond to the input signal $E_i$ as shown in chain lines in FIG. 2C. Accordingly, the indication on the indicator M will represent the received field level by indicating the level, or magnitude of the input signal $E_i$.

Resistors $R_4$ and $R_5$, coupled with the emitter-base capacitance of transistor $Q_3$ form a low-pass filter. Similarly, resistors $R_{14}$ and $R_{15}$ and the emitter-base capacitance of transistor $Q_4$ also form a low-pass filter. Transistors $Q_3$ and $Q_4$ are also selected to have a characteristic that is relatively insensitive at high frequencies. As a result, currents $I_{C3}$ and $I_{C4}$ are essentially DC currents.

In the indicating circuit according to this invention, only that portion of the magnitude of the input signal $E_i$ exceeds the dynamic range of the amplifiers 21 and 22 is utilized for indication of the input signal level. When the received signal level is too low, the indicator M will not draw current to provide an indication. In other words, the level of the input signal $E_i$ has to be sufficient to drive at least one of the transistors $Q_1$, $Q_2$, $Q_7$, and $Q_8$ outside its linear range (to saturation or to cutoff) before the indicator M begins to draw current. Because the indicator M does not place a drain on amplifiers 21 and 22 when the magnitude of the signal $E_i$ is small, the amplifiers 21 and 22 do not suffer a signal loss as a result of the level indication.

Further, the simple construction of this circuit enables the intermediate frequency amplifiers 1, 2, 3 to be formed as an integrated circuit.

Figure 3:
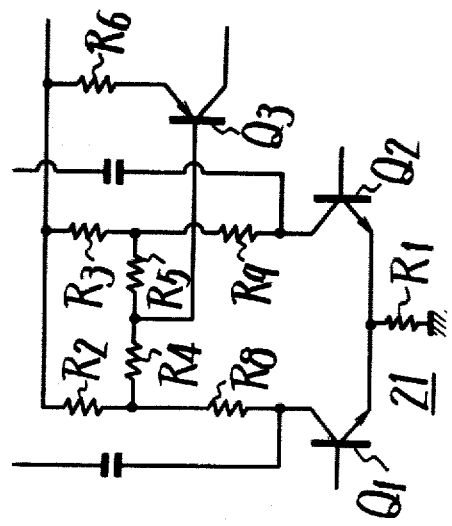
FIG. 3 is a partial circuit diagram illustrating another embodiment of this invention.

In FIG. 3 which illustrates another embodiment of this invention, elements corresponding to those described above with reference to FIG. 1 are identified by the same reference numerals. As shown on FIG. 3, if the quiescent collector current $I_0$ or the values of resistors $R_2$ and $R_3$ are relatively large so that the voltage $V_P$ is too low when the magnitude of the intermediate frequency input signal $E_i$ is zero, additional resistors $R_8$ and $R_9$, of equal value, can be included between the collectors of transistors $Q_1$ and $Q_2$ and the resistors $R_2$ and $R_3$, respectively. Here the series-connected resistors $R_2$, $R_8$ and $R_3$, $R_9$ act as voltage dividers. Resistors $R_4$ and $R_5$ are coupled between the junction formed between resistors $R_2$ and $R_8$ and the junction formed between resistors $R_3$ and $R_9$. The arrangement of the resistors $R_2$, $R_3$, $R_4$, $R_5$, $R_8$ and $R_9$ acts to raise the voltage $V_P$ to an appropriate level.

Although illustrative embodiments of the invention have been described in detail with reference to the accompanying drawings, it will be apparent that the invention is not limited thereto, and that many modifications and variations may be effected therein by one skilled in the art without departing from the spirit or scope of this invention as defined in the appended claims.

What is claimed is:

1. A circuit for applying to a level indicator a signal indicative of the magnitude of an input signal comprising:
    a first transistor and a second transistor each having first and second current-carrying electrodes and a control electrode;
    first and second resistors respectively connecting the first current-carrying electrodes of said first and second transistors to a first voltage point;
    means connecting the second current-carrying electrodes of said first and second transistors to a second voltage point;
    means for applying an input signal to the control electrodes of said first and second transistors;
    level-sensing circuit means for supplying to said level indicator an indicating signal whose level is related to the magnitude of the input signal; and
    means connecting the first current-carrying electrode of said first transistor to said level-sensing circuit means and establishing a threshold for said input signal such that the level-sensing circuit means supplies said indicating signal to said level indicator only when the magnitude of said input signal exceeds said threshold.

2. A circuit according to claim 1, wherein said means connecting the second current-carrying electrodes of said first and second transistors to a second voltage point includes a resistance having a first end connected commonly to the second current-carrying electrodes of both said first and second transistors and a second end connected to said second voltage point.

3. A circuit according to claim 1, wherein said level-sensing circuit means includes a third resistor and a third transistor having first and second current-carrying electrodes and a control electrode; and wherein the first current-carrying electrode of said third transistor supplies said indicating signal, the second current-carrying electrode of said third transistor is coupled by said third resistor to said first voltage point, and said means connecting the first current-carrying electrode of said first transistor to said level-sensing circuit means is coupled to the control electrode of said third transistor.

4. A circuit according to claim 3, wherein said means connecting the first current-carrying electrode of said first transistor to said level-sensing circuit means includes fourth and fifth resistors connected to the first current-carrying electrodes of said first and second transistors, respectively, and also connected together so as to define a junction therebetween; and said junction is connected to the control electrode of said third transistor.

5. A circuit according to claim 4, wherein said first and second resistors are of equal value and said fourth and fifth resistors are of equal value.

6. A circuit according to claim 4, wherein said first transistor has a range of substantially linear amplification and the values of said first, second, third, fourth and fifth resistors are chosen so that said first current-carrying electrode of said third transistor only supplies said indicating signal when said input signal is sufficient to drive said first transistor outside its range of substantially linear amplification.

7. A circuit according to claim 4, wherein said indicator includes current indicating means for indicating the strength of a current, and a current mirror circuit having an input current path and an output current path, said input current path being connected to receive said indicating signal and said output current path being connected with said current-indicating means to supply thereto said current.

8. A circuit according to claim 4, further comprising fourth and fifth transistors each having first and second current-carrying electrodes and a control electrode; sixth and seventh resistors respectively connecting said first current-carrying electrodes of said fourth and fifth transistors to said first voltage point; another resistance connecting said second electrodes of said fourth and fifth transistors to said second voltage point; means coupling the first current-carrying electrodes of said first and second transistors to the control electrodes of said fourth and fifth transistors, respectively; an eighth resistor; a sixth transistor having first and second current-carrying electrodes and a control electrode, said first current-carrying electrode of the sixth transistor being coupled with the first current-carrying electrode of said third transistor, said second current-carrying electrode of the sixth transistor being coupled by said eighth resistor to said first voltage point; and ninth and tenth resistors connected in series between the first current-carrying electrodes of said fourth and fifth transistors and defining a junction therebetween, said junction of the ninth and tenth resistors being connected to the control electrode of said sixth transistor.

9. A circuit according to claim 3, wherein said first and second resistors are each formed of a first voltage-divider resistance and a second voltage-divider resistance connected in series between the first current-carrying electrode of the respective one of said first and second transistors and said first voltage point so as to define a junction therebetween; said means connecting the first current-carrying electrode of said first transistor to said level-sensing circuit means includes a fourth and a fifth resistor each connected to the junction formed in said first and said second resistors respectively, and also connected together to form a junction therebetween; and the latter junction is coupled to the control electrode of said third transistor.

10. A circuit for supplying to an indicator an indicating signal representing the magnitude of an input signal comprising:

means for providing said input signal in the form of a pair of complementarily fluctuating signals;

differential amplifier means receiving said complementarily fluctuating signals for providing a pair of amplified outputs representing said complementarily fluctuating signals, said differential amplifier means including a pair of transistors, each having a linear region of amplification for said input signal between cutoff and saturated regions, and means biasing said pair of transistors so that the sum of currents flowing through said transistors of said pair is at a constant level when said input signal is of a magnitude such that said transistors amplify in their linear regions but said sum of currents fluctuates when the magnitude of said input signal exceeds a predetermined threshold so as to drive one of said transistors to one of its cutoff and saturated regions;

circuit means for supplying said indicating signal to said indicator; and detecting means connecting said differential amplifier means to said circuit means and detecting when said sum of currents fluctuates from such constant level so that said circuit means supplies said indicating signal only when the magnitude of said input signal exceeds said predetermined threshold.

* * * * *